United States Patent [19]

Kurth et al.

[11] 4,321,417
[45] Mar. 23, 1982

[54] SOLAR CELL MODULES

[75] Inventors: William T. Kurth, Beverly Farms; William B. Andrulitis, Manchester, both of Mass.

[73] Assignee: Exxon Research & Engineering Co., Florham Park, N.J.

[21] Appl. No.: 920,693

[22] Filed: Jun. 30, 1978

[51] Int. Cl.³ ............................................ H01L 31/04
[52] U.S. Cl. ..................................... 136/246; 136/251
[58] Field of Search ................... 136/89 PC, 246, 251

[56] References Cited

U.S. PATENT DOCUMENTS

| | | | |
|---|---|---|---|
| 3,973,994 | 8/1976 | Redfield | 136/89 |
| 4,009,054 | 2/1977 | Gochermann et al. | 136/89 P |
| 4,097,308 | 6/1978 | Klein et al. | 136/89 H |
| 4,116,718 | 9/1978 | Yerkes et al. | 136/89 PC |

OTHER PUBLICATIONS

N. F. Shepard, "Quarterly Report No. 2, Development and Testing of Shingle-Type Solar Cell Modules", DOE/JPL-954607-78/1 (Jan. 1978), pp. 3-10, 3-11, 3-14, 3-15, 6-1.

*Primary Examiner*—Aaron Weisstuch
*Attorney, Agent, or Firm*—Joseph J. Dvorak

[57] ABSTRACT

Solar cell modules having light scattering surfaces at least in the land areas between a plurality of arrayed solar cells and optically coupled to the cells provide increased module output over modules not provided with light scattering land areas. Insolation impinging on the light scattering surfaces is diffused upwardly through the optical coupling medium and then downwardly toward a solar cell, thereby increasing the output of the module.

9 Claims, 6 Drawing Figures

SOLAR CELL MODULES

FIELD OF THE INVENTION

This invention relates to a technique for enhancing the output of solar cell modules. More particularly, the present invention relates to an improved solar cell module designed to utilize light impinging on areas between the cells which would normally not be utilized in photoelectric conversion, thereby increasing the power output of the cell.

BACKGROUND OF THE INVENTION

A solar cell array comprises a plurality of individual cells and interconnector means for electrically connecting adjacent cells in a matrix. Typically, the individual solar cells are arranged in columns and rows and the interconnector means are positioned so as to connect the cells in the requisite series and/or parallel circuit arrangement. This circuit arrangement, of course, depends upon the desired output voltage and current at the module peak power point.

Generally, for terrestrial applications, a solar cell array is fabricated and sold as a module comprising the solar cell array mounted on an electrically nonconductive support member having electric output terminals provided therein. The module also has a top cover over the solar cell array. This cover is a transparent protective coating which protects the solar cells against environmental hazards. Typically the module is fitted into a metal frame which provides mechanical strength for the array and protects the solar cell array against damage due to environmental loadings such as from wind, snow, ice, rain, etc. The metal frame also serves as a means for mounting the module at the proper angle to receive isolation.

The individual solar cells used in forming a solar cell array for terrestrial applications are circular discs or wafers having diameters generally in the range of 2 to 4 inches and formed from a polycrystalline silicon ingot which is melted, and then reformed into a cylindrical ingot of single crystalline silicon. The discs or wafers are then cut from the cylindrical ingot. These circular cells are quite common in commercial use because they are relatively less expensive per unit area than cells having another geometry. When the circular cells are arrayed, however, the total active surface area of the array, i.e., of the solar cells, is less than the area required for mounting the array. Thus, not all the solar radiation which impinges on the module is utilized, since only some of the solar radiation impinges on active solar cell areas and some of the radiation impinges on inactive areas between the circular solar cells.

A number of techniques have been proposed for increasing the efficiency and effectiveness of solar cell modules by focusing incident solar radiation onto active cell areas. For example, mirrors and the like have been proposed to reflect solar radiation and concentrate the radiation in a given area. In this regard, see U.S. Pat. No. 3,990,914, wherein a tubular solar cell is described which is mounted in a parabolic mirror for concentration of solar radiation onto the solar cells. Also, mention should be made of U.S. Pat. No. 2,904,612 describing a reflector-type device in which the land areas between the circular solar cells consist essentially of inverted intersecting frustums of cones circumscribing the cells.

Another technique employed to enhance solar cell module output is the use of lenses. In U.S. Pat. No. 3,018,313, for example, a solar cell module is described which has an array of lenses covering the module so as to concentrate the light impinging on the cover of the solar cell array to converge downwardly toward the active solar cell area. In U.S. Pat. No. 4,053,327, yet another light focusing arrangement is described wherein the cover of a solar cell module comprises a plurality of converging lenses arranged so as to direct the light incident on the module so that it does not fall on the grid lines of the front electrode of the solar cells in the array. Yet another optical system for focusing incident radiation onto the solar cells so as to increase electric output and increase the efficiency of operation of such modules is disclosed in U.S. Pat. No. 4,042,417.

In addition to reflecting solar insolation from inactive areas of solar cell modules to the active areas of solar cells, it has also been proposed to use reflective surfaces below very thin solar cells so that light which penetrates the active solar cell area without being absorbed can be reflected back again to the active layer. See, for example, U.S. Pat. No. 3,973,994.

Notwithstanding the advances made in the past in increasing the efficiency of solar cell modules, there still remains a very definite need for a solar cell module which will utilize all the light energy that is available as effectively and efficiently as possible and importantly without the necessity of complex, expensive and environmentally vulnerable optical systems.

SUMMARY OF THE INVENTION

Generally speaking, the present invention is based on the discovery that the electric output of a solar cell module can be enhanced by providing light scattering surfaces in the land areas between the solar cells and which is optically coupled therewith by an optical medium such that light impinging on the light scattering surfaces will be internally reflected toward an active cell area. Indeed, it is particularly preferred that the light scattering surface have a specular component of less than about 5% as determined by goniophotometry.

Thus, in one embodiment of the present invention there is provided a solar cell module comprising a plurality of solar cells arrayed on the bottom surface of a rigid light transparent material in which at least the land areas between the cells are light scattering surfaces and which surfaces are coupled to the cells by an optical medium typically having an index of refraction in the range of 1.5 to 3.0.

In another embodiment of this invention, an improved solar cell module comprises a plurality of solar cells arrayed on the top surface of a support structure in which at least the land areas between the solar cells are light scattering surfaces having a specular component of less than 5% as determined by goniophotometry, which surfaces are coupled by an optical medium to said solar cells.

Advantages and other features of the invention will be apparent from the specification which follows and from the drawings wherein like numerals are used throughout to identify like parts.

DETAILED DESCRIPTION OF THE INVENTION

As indicated hereinabove, in the practice of the present invention a plurality of circular solar cells are arrayed on a planar support structure in module fashion. One typical useful support structure for the arrayed circular solar cells is disclosed in U.S. Pat. No. 4,132,570, which patent is incorporated herein by reference. Other support structures may be employed in the practice of the present invention without departing from the spirit and scope hereof. Nonetheless, particular reference will be made herein to the support of U.S. Pat. No. 4,132,570.

Figure 1:
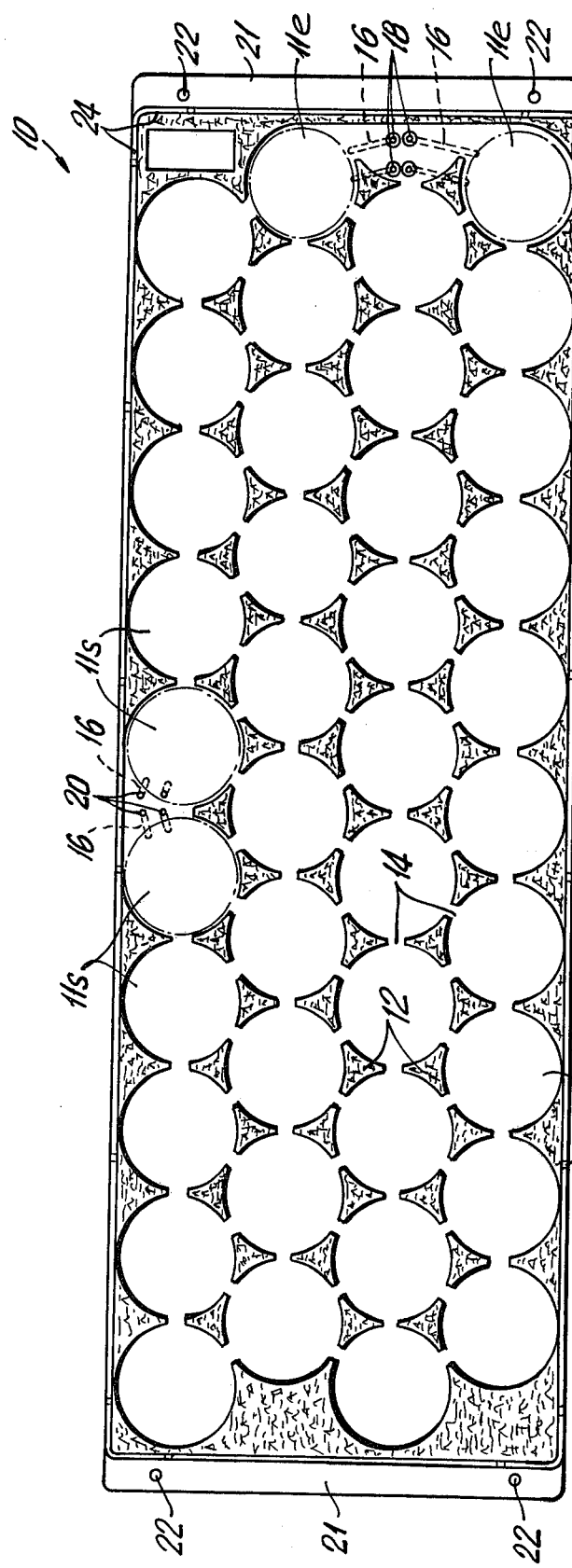
FIG. 1 is a top plan view of one type of support structure useful in the practice of the present invention.

Referring now to FIG. 1, there is shown a support structure 10 which preferably is formed from an electrically nonconductive material such as high density, high strength plastic. As is shown in FIG. 1, support structure 10 is generally and preferably rectangular in shape. Typical dimensions for the support are 46 inches long by 15 inches wide by 2 inches deep.

Located on the top surface of structure 10 are a plurality of wells 11. Each well 11 is designed to accommodate a photovoltaic cell. As is shown in FIG. 1, wells 11 are generally circular, thereby accommodating circular solar cells. The diameter of the well is slightly larger than the diameter of the silicon solar cell and the depth of the well is about 0.1 inches deep up to a depth equal to the thickness of the solar cell for which it is designed to accommodate. Wells 11 are separated one from the other by a plurality of land areas 12 through which openings or gates 14 are provided. Gates 14 provide access not only to succeeding wells 11 in the same row but also to wells 11 in adjacent rows, thereby permitting series and/or parallel connections between solar cells placed in the wells 11. Terminal gates 16 are also provided to accommodate interconnections between solar cells placed in end walls designated 11E and side wells designated 11S so as to accommodate interconnections between such solar cells and output terminals.

Around the perimeter on the top surface of structure 10 is a perimeter dike 24. Dike 24 serves to contain any encapsulating material that may be used to protect the solar cells and to hold them in place on the structure 10. In the event that the rigid transparent material is employed to cover the solar cells as well, the dike 24 also serves to position the rigid transparent cover sheet material and to protect its edges from chipping or otherwise cracking.

Figure 2:
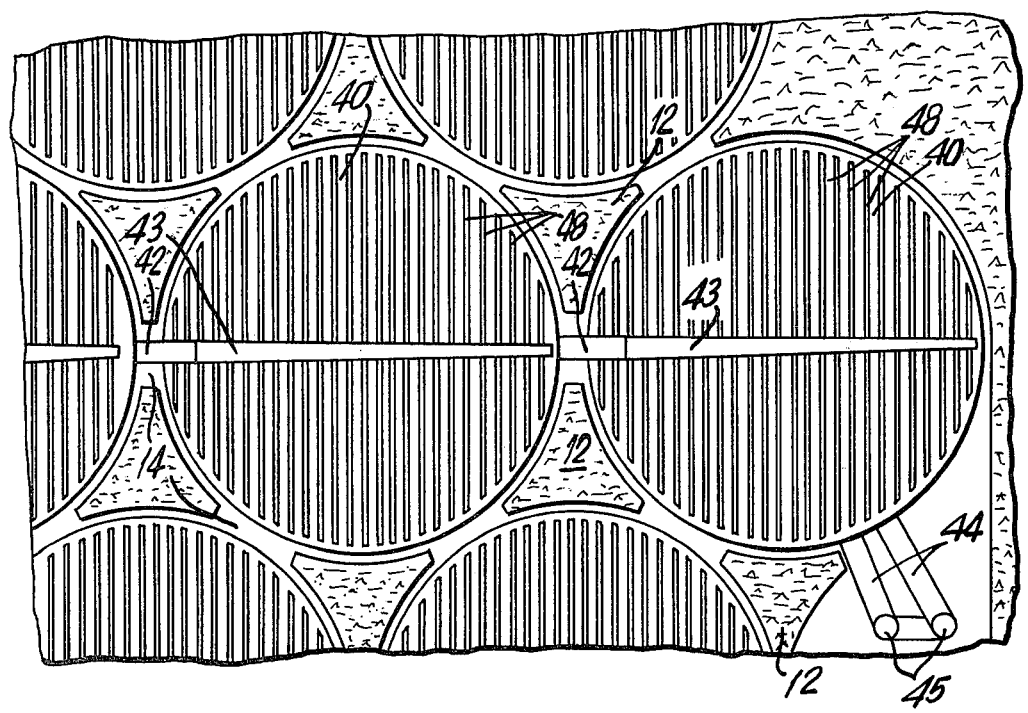
FIG. 2 is a fragmentary top plan view showing solar cells located on the support structure of FIG. 1 and interconnected in series.

As is shown in FIG. 2, arrayed on the top surface of support structure 10 are a plurality of solar cells 40 shown in this instance connected in series by means of flexible interconnectors 42. Thus, the electrode on the bottom of one solar cell 40 is connected via flexible end connector 42 to the top bus bar 43 of the next succeeding solar cell 40. The bus bars 43 connect the electrically conductive fingers 48 on the surface of the cell. As is well known, these solar cells can be interconnected in other serial and/or parallel arrangements and are ultimately tied into a termination post such as posts 45.

According to the present invention, the land areas 12, i.e. the area between the individual solar cells, are provided with light scattering surfaces for reflecting light, which normally impinges on the land area, in a diffused manner. Such scattered radiation when it reaches the front surface of the optical medium will be totally trapped and reflected toward the back surface if it makes an angle at the front surface of the optical medium greater than the critical angle. The critical angle, of course, refers to the largest value which the angle of incidence may have for a ray of light passing from a more dense medium to a less dense medium. If the angle of incidence ($\phi_i$ in FIG. 3) exceeds the critical angle, the ray of light will not enter the less dense medium but will be totally internally reflected back to the denser medium.

In any event, it is particularly important in the practice of the present invention that a solar cell array, mounted on the support structure, be coupled with an optically transparent cover material. In other words, there should be no air spaces between the solar cells and the optical medium or between the land areas and the optical medium. Typically, the optically transparent cover material will have an index of refraction between about 1.3 to about 3.0 and will be in the range of about $\frac{1}{8}$ inch up to about $\frac{3}{8}$ inch thick, and preferably greater than $\frac{1}{4}$ inch thick. Such an optically transparent cover material is shown as 54 for example in FIG. 3.

The optically transparent cover material employed in the practice of the present invention, for example, may be any one of the silicone rubber encapsulating materials generally known to the electronics and solar cell industry or other ulraviolet light stable and weather resistant plastics such as polycarbonates, acrylates and urethanes or combinations of one or more of the aforesaid polymer materials and glass.

As indicated hereinabove, it is important in the practice of the present invention that the land areas 12 between the individual solar cells be substantially coplanar with the top surface of the solar cells; and, in any event, the top surface of the land areas 12 should not be below the bottom surface of the solar cells. Additionally, the land areas between the individual solar cells are light scattering surfaces. Typically, such light scattering surfaces will have at least one monolayer of a particulate material having an integrated solar absorptance of about 0.18 and lower. Preferably, the particulate material will have an integrated solar absorptance below about 0.16. White particulate solids, such as zinc oxide, titanium dioxide, calcium carbonate and the like, on the surface of the land areas, are very effective for light scattering surfaces since white objects reflect incident energy throughout the visible spectrum in a diffuse manner.

In general, the particulate solids on the surface of the land areas should be substantially the same size as the wavelength of light and, therefore, will effectively scatter the light incident thereon. Thus, the particle diameter of the particulate material on the land area may range from about 2000 to about 8000 Angstroms in diameter.

The particulate material covering the land area, as indicated hereinabove, should be at least one monolayer thick and may be as thick as $\frac{1}{8}$".

As will be readily appreciated, the light scattering surface can be provided not only on land areas 12 but also on any space on the top surface of the module, i.e. the surface for supporting the cells and receiving solar radiation. Thus, areas such as gates 14, indeed, even in the outer perimeter of the wells 11, can be provided with light scattering surfaces. This surface can be applied to the land areas when molding or by generally well known surfacing techniques such as spraying, painting and the like, or by using a lamination of thin white sheet material such as white plastic films such as those sold under the trademarks Mylar and Tedlar by duPont, Wilmington, Del., and Kodar by Eastman Kodak, Rochester, N.Y.

In one embodiment of the present invention the support structure 10 is molded from an electrically nonconductive material which is high density, high strength plastic that has a low index of refraction and which has dispersed therein particles having approximately the same size of the wavelength of light, which have absorptances below about 0.18, such as zinc oxide, titanium dioxide and calcium carbonate, etc. Indeed, a commercially available white polyester resin sold under the tradename of SM-609 by Polyply, Inc. of Grand Haven, Mich., particularly preferred not only because of its high strength and its stability when exposed for long periods of time to ultraviolet radiation but because of the low absorptance of the white colored pigment employed in such polyester resin.

Figure 6:
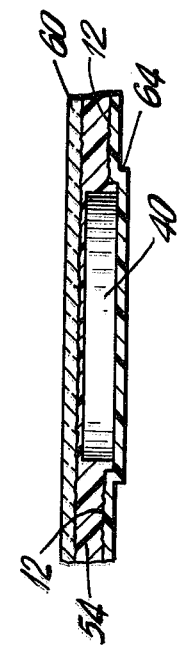
FIGS. 4, 5 and 6 are fragmentary diagrammatic side elevations illustrating other embodiments of the present invention.
Figure 5:
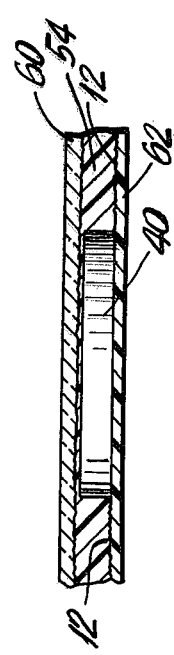

In yet another embodiment of the present invention shown in FIGS. 5 and 6, the solar cells 40 are supported by a rigid, planar, light transparent top support structure 60 which is formed from an electrically nonconductive material such as glass. This top support structure 60 serves not only as the structural support for the solar cell array but also as a primary optical medium. A plurality of light scattering surfaces are arranged at last in the land areas 12 between the solar cells 40. Preferably the light scattering surface is the top surface of a thin white plastic film such as sheet 62 of FIG. 5 located to be coplanar with the bottom of cell 40. Optionally the film can be thermoformed to have a raised land area substantially coplanar with the top of solar cell 40. Such a thermoformed film 64 is shown in FIG. 6. An optical medium 54 such as silicone encapsulant bonds the light scattering surfaces 12 and the solar cells 40 to the top support structure 60 as well as assures that there is no air space between the solar cells 40 and the primary optical medium 60 or between the light scattering surfaces and the primary optical medium 60. The entire assembly can be mounted in a metal frame (not shown) for mounting the assembly to receive isolation.

Figure 3:
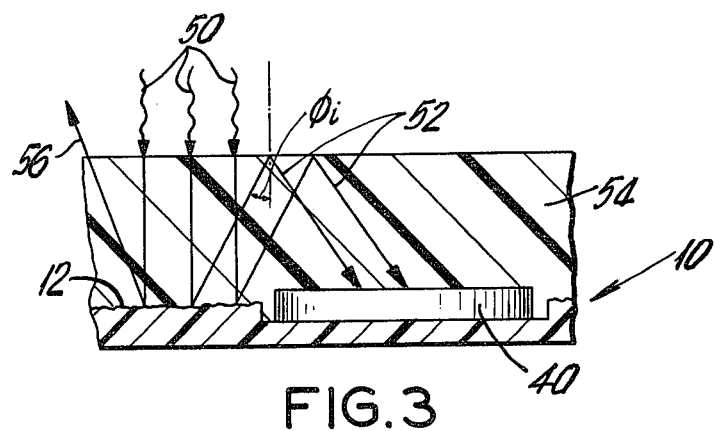
FIG. 3 is a fragmentary diagrammatic side elevation illustrating one embodiment of the present invention.

As shown in FIG. 3, the solar insolation, designated generally as lines 50, which impinges on the land area 12 or nonactive area of the support structure is scattered because of the light scattering or white surface thereof. Some of the light which is scattered at shallow angles (see lines 52) will be trapped by the optical cover surface 54 and redirected so as to fall on the active surface of a solar cell 40, i.e., totally internally reflected. Some of the light, of course, will be reflected from the surface of the land area 12 and will "escape" from the optical cover surface 54 (see line 56, for example).

Figure 4:
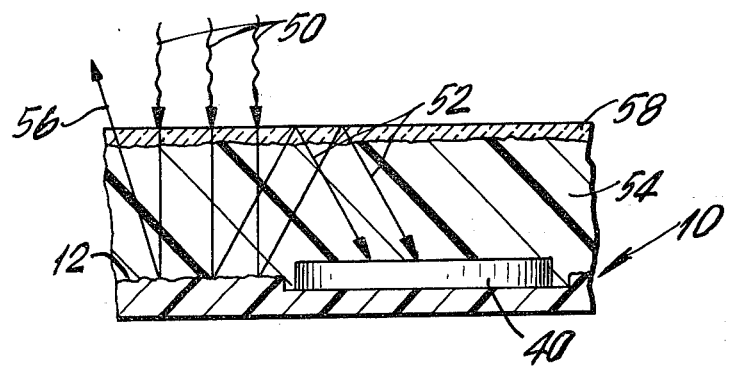

As can be seen in FIG. 4, the incident solar radiation, designated by line 50, falling on the inactive areas of the support structure, e.g., land area 12, is scattered by the white light scattering surface thereon and is trapped by the encapsulant material as well as the cover glass 58. Indeed, the cover glass enhances the degree of redirection of solar radiation falling on the inactive areas of the solar cell so as to direct that radiation to the active area of the module of solar cell 40.

Surprisingly, it has been discovered that many white surfaces are not truly able to reflect light in a totally diffuse manner, but these surfaces do, in fact, have a "quasi-specular" light reflective component. The term "quasi-specular" light reflective component is used to differentiate between the term "specular" reflection as generally understood in the art of measuring, describing and evaluating the ability of a specimen to reflect light flux. "Specular" reflection indicates that only light that is mirror reflected is included for measurement. In other words, light that is reflected within a very narrow angular range is measured. Typically, metallic mirrors exhibit pure specular reflection and the cone of measurement is less than ½°. In contrast thereto, "diffuse" reflection refers to light that is distributed in all directions without any discontinuities or abrupt increases in reflection at any angle. Diffuse reflection is typically highest normal to the surface and falls monotonically as the viewing angle approaches the horizon.

As indicated, it has been found that many surfaces such as the white polyester surfaces, the white plastic films and the white painted surfaces mentioned hereinabove have a nearly specular or quasi-specular reflective component of about 10%. Texturizing the white surface, for example, by surface roughening via sand blasting, sanding, etc., tends to reduce the quasi-specular component and enhance the output of the solar cell module when that texturized surface is employed.

The general procedure for evaluating the manner in which a specimen material geometrically redistributes light is called goniophotometry; and, the method of making such measurements is set forth in ASTM Test Method E-167-63.

EXAMPLE 1

A number of white polyester samples were placed in a goniophotometer and illuminated with a conventional microscope lamp with nearly collimated light. The intensity of reflected light was measured with a photomultiplier for different angles of incidence and reflection. After the sample was sand blasted and the light measurements were remeasured, this test revealed that reflection from the untexturized surface consists of a background of diffusely reflected light with a superimposed quasi-specular component. This quasi-specular portion comprises approximately 10% to 20% of the total reflected light. After sand blasting, sanding or similar surface roughening the specular component is diminisued in favor of increased diffused illumination. This diffuse reflection is seen to be larger at every angle after sand blasting. Because of the increased amount of diffusively reflected light at angles favoring light trapping, i.e. at angles greater than the critical angle, the output of the finished solar cell module will be increased.

EXAMPLE 2

A solar cell module was fabricated consisting of 40 cells each having a 4-inch diameter connected in series. The total area of the cells was 314,160 mm². The land area between the cells was a smooth, white polyester surface and the solar cell array was encapsulated in silicone rubber having a thickness of about 0.10 inches. The output ($I_{sc}$) of the module at a standard temperature of 28° C. was 2.0 amps, approximately 10% higher than a similarly constructed module with no reflective pigment.

EXAMPLE 3

A solar cell module identical to that of Example 2 was fabricated except that the top surface of the support was sand blasted. The output ($I_{sc}$) of this module at standard temperature of 28° C. was 2.07 amps, which is about 3.5% greater than the module surface which was not sand blasted. Indeed, the increase in module output for a number of repetitive tests is generally in the range of about 3% to about 5% for modules of a type of Example 3 over those of Example 2.

EXAMPLE 4

A module similar to that of Example 2 was fabricated except that a sheet of Sunadex glass sold by ASG, Inc. of Kingsport, Tenn. was employed with the silicone encapsulant. The total thickness of the silcone and glass was about 0.175 inches. At standard temperature conditions of 28° C., the module output ($I_{sc}$) was 2.2 amps which is 10% greater than the cell of Example 1.

EXAMPLE 5

A number of modules were fabricated consisting of 100 mm diameter silicon solar cells connected in series. Each module had a top support structure consisting of a low iron, high transmission, tempered glass that provided a smooth and durable cover as well as cell support. The cells were bonded to the glass and encapsulated by a silicone rubber compound which sealed the cells and the interconnections from the environment. Some modules were also provided with a white Mylar backing (see FIG. 5, for example) which was bonded to the encapsulant and thereby optically coupled to the cells. The typical output of the module with the Mylar light scattering surface at standard temperature of 28° C. was 2.2 amps, which was generally from 8% to 10% higher than similar modules which did not have the Mylar light scattering surfaces.

What is claimed is:

1. A solar cell module comprising:
an electrically nonconductive light transparent support structure having a top surface and a bottom surface;
a plurality of solar cells arrayed on and bonded to the bottom surface of said support structure;
land areas between said arrayed solar cells having roughened white light scattering surfaces selected from plastic films and paint, said light scattering surfaces having a light reflective specular component of less than about 5% as determined by goniophotometry;
a light transparent optical medium coupled to said solar cells, said support and said light scattering surfaces whereby light impinging on said light scattering surfaces of said land areas is diffused upwardly through said optical medium and forms an angle at the top surface of said support structure which is greater than the critical angle whereby said diffused light is internally reflected downwardly toward said solar cells.

2. The module of claim 1 wherein the optical medium has an index of refraction between 1.3 and 3.0.

3. The module of claim 2 wherein the optical medium is a silicone rubber encapsulant.

4. The module of claim 3 wherein the support is glass.

5. The module of claim 4 wherein the light scattering surfaces are substantially coplanar with the top surface of said solar cells.

6. A solar cell module comprising:
an electrically nonconducting planar support structure having a top surface and a bottom surface, the bottom surface of which is a roughened white light scattering surface selected from white plastic films and white paint and having a reflective specular component of less than about 5% as determined by goniophotometry;
a plurality of spaced apart solar cells arrayed on the top surface of said support;
a glass cover on top of said arrayed solar cells; and
a light transparent encapsulant for bonding and optically coupling said cells and said glass to said support whereby light impinging on the top surface of said support between said spaced apart solar cells is diffused upwardly through said encapsulant and glass and forms an angle at the top surface of said glass which is greater than the critical angle whereby said diffused light is internally reflected downwardly toward said solar cells.

7. A solar cell module comprising:
an electrically nonconducting planar support structure having a top surface and a bottom surface, the top surface of which is a roughened white polyester light scattering surface;
said light scattering surface having a light reflective specular component of less than 5% as determined by goniophotometry;
a plurality of spaced apart solar cells arrayed on the top surface of said support; and
a light transparent optical medium coupling said support and said solar cells whereby light impinging on the light scattering surfaces is diffused upwardly through said optical medium and forms an angle at the top surface thereof which is greater than the critical angle whereby said diffused light is reflected upwardly toward said solar cells.

8. The module of claim 7 wherein the optical medium has an index of refraction between 1.3 and 3.0.

9. The module of claim 8 wherein said optical medium is selected from the group consisting of glass, plastic and mixtures thereof.

* * * * *